United States Patent
Mikubo et al.

(10) Patent No.: US 6,611,057 B2
(45) Date of Patent: Aug. 26, 2003

(54) SEMICONDUCTOR DEVICE ATTAINING BOTH HIGH SPEED PROCESSING AND SUFFICIENT COOLING CAPACITY

(75) Inventors: Kazuyuki Mikubo, Tokyo (JP); Sakae Kitajo, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/986,413

(22) Filed: Nov. 8, 2001

(65) Prior Publication Data

US 2002/0053726 A1 May 9, 2002

(30) Foreign Application Priority Data

Nov. 9, 2000 (JP) ........................... 2000-341390

(51) Int. Cl.[7] .............................................. H01L 23/34
(52) U.S. Cl. ...................... 257/714; 257/713; 257/715; 257/717; 257/720
(58) Field of Search ................................ 257/685, 678, 257/686, 697, 693, 692, 706, 707, 712, 713, 714, 715, 716, 717, 720, 723, 722; 361/704

(56) References Cited

U.S. PATENT DOCUMENTS

| | | | |
|---|---|---|---|
| 5,655,290 A | * | 8/1997 | Moresco et al. ............. 29/830 |
| 6,014,313 A | * | 1/2000 | Hesselbom ................ 361/704 |
| 6,310,771 B1 | * | 10/2001 | Chien |
| 6,317,326 B1 | * | 11/2001 | Vogel et al. ................. 29/830 |
| 6,400,012 B1 | * | 6/2002 | Miller et al. ............... 257/712 |
| 6,408,630 B2 | * | 6/2002 | Macias et al. ............... 62/3.7 |
| 2002/0062648 A1 | * | 5/2002 | Ghoshal ..................... 62/3.7 |

FOREIGN PATENT DOCUMENTS

JP         5-275584       10/1993

* cited by examiner

Primary Examiner—Nathan J. Flynn
Assistant Examiner—Victor A. Mandala, Jr.
(74) Attorney, Agent, or Firm—Whitham, Curtis & Christofferson, P.C.

(57) ABSTRACT

A semiconductor device includes two or more semiconductor modules which are stacked up into three-dimensional structure. Each semiconductor module includes a wiring board, one or more IC chips which are mounted on the wiring board, and one or more heat sinks which are attached to the IC chips via a thermal-conductive adhesive and are forcedly cooled by a coolant flowing through channels which are formed therein. The wiring board of each semiconductor module is provided with sockets having I/O pins and concavities. Electrical connection between adjacent semiconductor modules of the semiconductor device is established by inserting the I/O pins of the sockets of one semiconductor module into the concavities of the sockets of the other semiconductor module. The channels in the heat sink are implemented by a plurality of channel grooves which are generated between a plurality of fins which are formed in a cavity inside the heat sink at predetermined intervals. The coolant is supplied to the channel grooves from outside and the IC chips are forcedly cooled by the coolant. Therefore, enough cooling capacity is ensured by use of low-profile heat sinks, thereby both high processing speed (due to high packing density and short signal lines between IC chips) and sufficient cooling capacity are attained.

22 Claims, 8 Drawing Sheets

SEMICONDUCTOR DEVICE ATTAINING BOTH HIGH SPEED PROCESSING AND SUFFICIENT COOLING CAPACITY

BACKGROUND OF THE INVENTION

The present invention relates to a semiconductor device, and in particular, to a semiconductor device having two or more IC modules which are stacked up into three-dimensional structure, in which both high speed operation and enough cooling capacity are realized.

DESCRIPTION OF THE RELATED ART

Computers that are used in the field of scientific and technological calculations are being required to perform vast amounts of calculations with high accuracy and with high processing speed. Especially, requirements for speeding up of the processing speed are increasing every year. One known method for meeting the requirement is to shorten the lengths of signal lines which are connecting IC chips on a board. By shortening the signal lines, high packaging density is attained and thereby signal transfer speed between the IC chips is increased. However, such high-density packaging (in which the IC chips are packed closely) causes rapid increase of heat emission density from each IC chip, thereby the speeding up of processing speed becomes difficult. A semiconductor device which will be described below has been proposed in order to resolve the heat emission problem.

Figure 1:
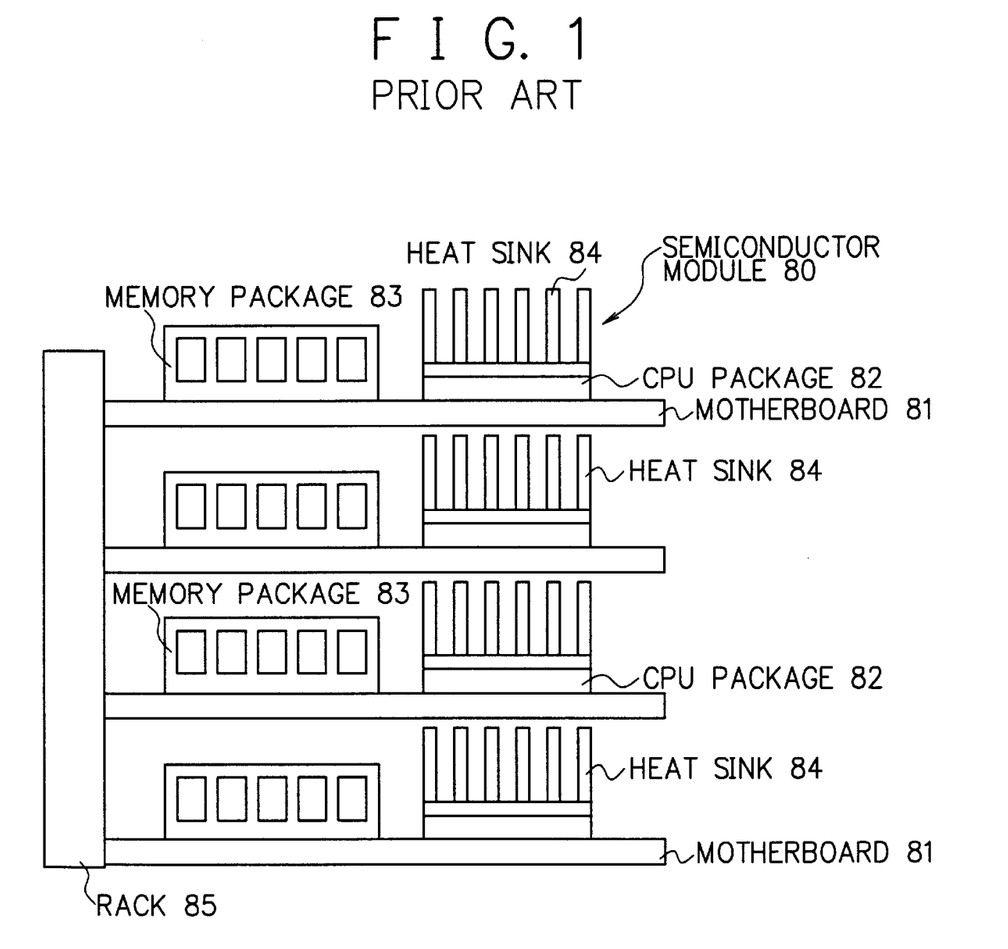
FIG. 1 is a schematic diagram showing an example of the composition of a conventional semiconductor device which is employed in supercomputers, parallel computers, etc.

FIG. 1 is a schematic diagram showing an example of the composition of a conventional semiconductor device which is employed in supercomputers, parallel computers, etc. The conventional semiconductor device of FIG. 1 includes four semiconductor modules 80. Each semiconductor module 80 includes a motherboard 81 and a plurality of packages (one or two high-speed high-power CPU packages 82, memory (DIMM: Dual In-line Memory Module) packages 83, etc.) which are closely mounted on the motherboard 81. When the CPU package 82 is energized, large amounts of heat emission occurs and the speed and reliability of the CPU package 82 is affected by the heat. Therefore, an air-cooled metal heat sink 84 is attached to the top surface of each CPU package 82 in order to maintain the temperature of the CPU package 82 below an allowable temperature. The heat sink 84 has a plurality of radiating fins which are arranged at predetermined intervals. Forced-air cooling of the CPU packages 82 is carried out by use of an unshown cooling fan which blows air on the radiating fins of the heat sinks 84. The semiconductor modules 80 having such composition are mounted on a rack 85 in parallel and at even intervals.

Meanwhile, a water cooling system for a supercomputer has been proposed and disclosed in NEC technical report Vol. 39, page 36 (1986). In the technique of the document, a plurality of high-heat-emission LSIs are arranged in a two dimensional array on a ceramic base, and each LSI is provided with a water channel for cooling the LSI. The water cooling system could achieve some effect of permitting total heat emission of 3.3 kW (approximately 40 W per LSI).

In Japanese Patent Application Laid-Open No. HEI5-275584, a cooling device has been proposed in order to cope with the increase of heat emission density when CPUs (for portable devices) of low power consumption are mounted closely. In the cooling device which is designed to be applied to small-sized electronic equipment such as notebook computers, a plurality of IC chips are mounted on a motherboard and such motherboards are stacked so as to have three-dimensional structure. The key feature of the cooling device is its specific three-dimensional structure, in which the motherboards on which the IC chips are mounted are stood upright and plate-like heat pipes (whose inner walls are formed to have capillary structure) are placed between the motherboards so as to make thermal contact with the IC chips (or the motherboards).

The operation of the cooling device is as follows. When heat emitted by the IC chips is conducted to the plate-like heat pipe, coolant in the plate-like heat pipe evaporates and the evaporated coolant moves to a low-temperature part of the plate-like heat pipe as bubble current. The evaporated coolant (bubble current) reaches a heat sink which is provided to the upper end of the plate-like heat pipe, and the evaporated coolant which is cooled by the heat sink is condensed into liquid. The coolant condensed into liquid returns to heated part of the plate-like heat pipe (near the IC chips) by capillarity or gravity. The cycle (evaporation →movement→condensation→movement→evaporation) is repeated by the coolant and thereby heat transport and cooling is carried out continuously. By the employment of the thin plate-like heat pipes, packing volume of the semiconductor device is reduced and signal lines between the IC chips are shortened in comparison with the conventional air cooling system using air-cooled heat sinks.

However, the conventional techniques which has been explained above involve the following problems or drawbacks.

In the conventional semiconductor device of FIG. 1, the volume ratio of the air-cooled heat sinks in the semiconductor device is necessitated to be large, thereby signal lines for providing connection between IC chips are necessitated to be long. The long signal lines cause delay and attenuation of signals, thereby speeding up of the processing speed becomes impossible.

In the technique of NEC technical report Vol. 39, the water cooling mechanism is necessitated to be large-sized when three-dimensional packing structure is constructed. Therefore, packing volume of the three-dimensional structure can not be made compact similarly to the case of the conventional semiconductor device of FIG. 1.

In the case of the technique of Japanese Patent Application Laid-Open No. HEI5-275584, cooling capacity can not be increased more than over 10 watts per chip if three-dimensional packing structure is constructed by use of high-speed high-power chips (100W class power consumption) which are employed for high-performance computers. Therefore, the technique of the document can not be employed for the cooling of high-power chips in three-dimensional packing structure.

SUMMARY OF THE INVENTION

It is therefore the primary object of the present invention to provide a semiconductor device in which both high packing density (short signal lines between IC chips) and sufficient cooling capacity can be attained.

In accordance with a first aspect of the present invention, there is provided a semiconductor device, in which a semiconductor module is constructed by use of a wiring board, one or more IC chips which are mounted on the wiring board and which emit heat during their operation, and one or more heat sinks which are attached to the IC chips via a thermal-conductive adhesive and are forcedly cooled by a coolant flowing through channels which are formed therein, and two or more of such semiconductor modules are stacked up into three-dimensional structure.

In accordance with a second aspect of the present invention, in the first aspect, the wiring board of each semiconductor module is provided with sockets having I/O pins and concavities. Electrical connection between adjacent semiconductor modules of the semiconductor device is established by inserting the I/O pins of the sockets of one semiconductor module into the concavities of the sockets of the other semiconductor module.

In accordance with a third aspect of the present invention, in the first aspect, the channels in the heat sink are implemented by a plurality of channel grooves which are generated between a plurality of fins which are formed in a cavity inside the heat sink at predetermined intervals.

In accordance with a fourth aspect of the present invention, in the third aspect, the heat sink includes: a first metal block having the channel grooves and the fins; and a second metal block which is joined to the first metal block so as to cover the fins of the first metal block.

In accordance with a fifth aspect of the present invention, in the third aspect, each of the fins of the heat sink is provided with slopes at its both ends.

In accordance with a sixth aspect of the present invention, in the third aspect, the width of the channel groove in the heat sink is set to 0.05 mm~0.4 mm.

In accordance with a seventh aspect of the present invention, in the sixth aspect, the width of the channel groove in the heat sink is set to 0.2 mm~0.25 mm.

In accordance with an eighth aspect of the present invention, in the third aspect, the length of the channel groove in the heat sink is set to the length of the IC chip or more.

In accordance with a ninth aspect of the present invention, in the first aspect, the thickness of the heat sink is set to 1 mm or less.

In accordance with a tenth aspect of the present invention, in the first aspect, the semiconductor device further comprises a forcedly air-cooled radiator for cooling the coolant.

In accordance with an eleventh aspect of the present invention, there is provided a semiconductor device comprising two or more semiconductor modules which are stacked up into three-dimensional structure. The semiconductor module includes a wiring board, one or more IC chips which are mounted on the wiring board and which emit heat during their operation, and one or more heat sinks which are attached to some of the IC chips via a thermal-conductive adhesive and are forcedly cooled by a coolant flowing through channels which are formed therein.

In accordance with a twelfth aspect of the present invention, in the eleventh aspect, the wiring board of each semiconductor module is provided with sockets having I/O pins and concavities. Electrical connection between adjacent semiconductor modules of the semiconductor device is established by inserting the I/O pins of the sockets of one semiconductor module into the concavities of the sockets of the other semiconductor module.

In accordance with a thirteenth aspect of the present invention, in the eleventh aspect, the channels in the heat sink are implemented by a plurality of channel grooves which are generated between a plurality of fins which are formed in a cavity inside the heat sink at predetermined intervals.

In accordance with a fourteenth aspect of the present invention, in the thirteenth aspect, the heat sink includes: a first metal block having the channel grooves and the fins; and a second metal block which is joined to the first metal block so as to cover the fins of the first metal block.

In accordance with a fifteenth aspect of the present invention, in the thirteenth aspect, each of the fins of the heat sink is provided with slopes at its both ends.

In accordance with a sixteenth aspect of the present invention, in the thirteenth aspect, the width of the channel groove in the heat sink is set to 0.05 mm~0.4 mm.

In accordance with a seventeenth aspect of the present invention, in the sixteenth aspect, the width of the channel groove in the heat sink is set to 0.2 mm~0.25 mm.

In accordance with an eighteenth aspect of the present invention, in the thirteenth aspect, the length of the channel groove in the heat sink is set to the length of the IC chip or more.

In accordance with a nineteenth aspect of the present invention, in the eleventh aspect, the thickness of the heat sink is set to 1 mm or less.

In accordance with a twentieth aspect of the present invention, in the eleventh aspect, the semiconductor device further comprises a forcedly air-cooled radiator for cooling the coolant.

BRIEF DESCRIPTION OF THE DRAWINGS

The objects and features of the present invention will become more apparent from the consideration of the following detailed description taken in conjunction with the accompanying drawings, in which.

DESCRIPTION OF THE PREFERRED EMBODIMENTS

Referring now to the drawings, a description will be given in detail of preferred embodiments in accordance with the present invention.

[Embodiment 1]

Figure 2:
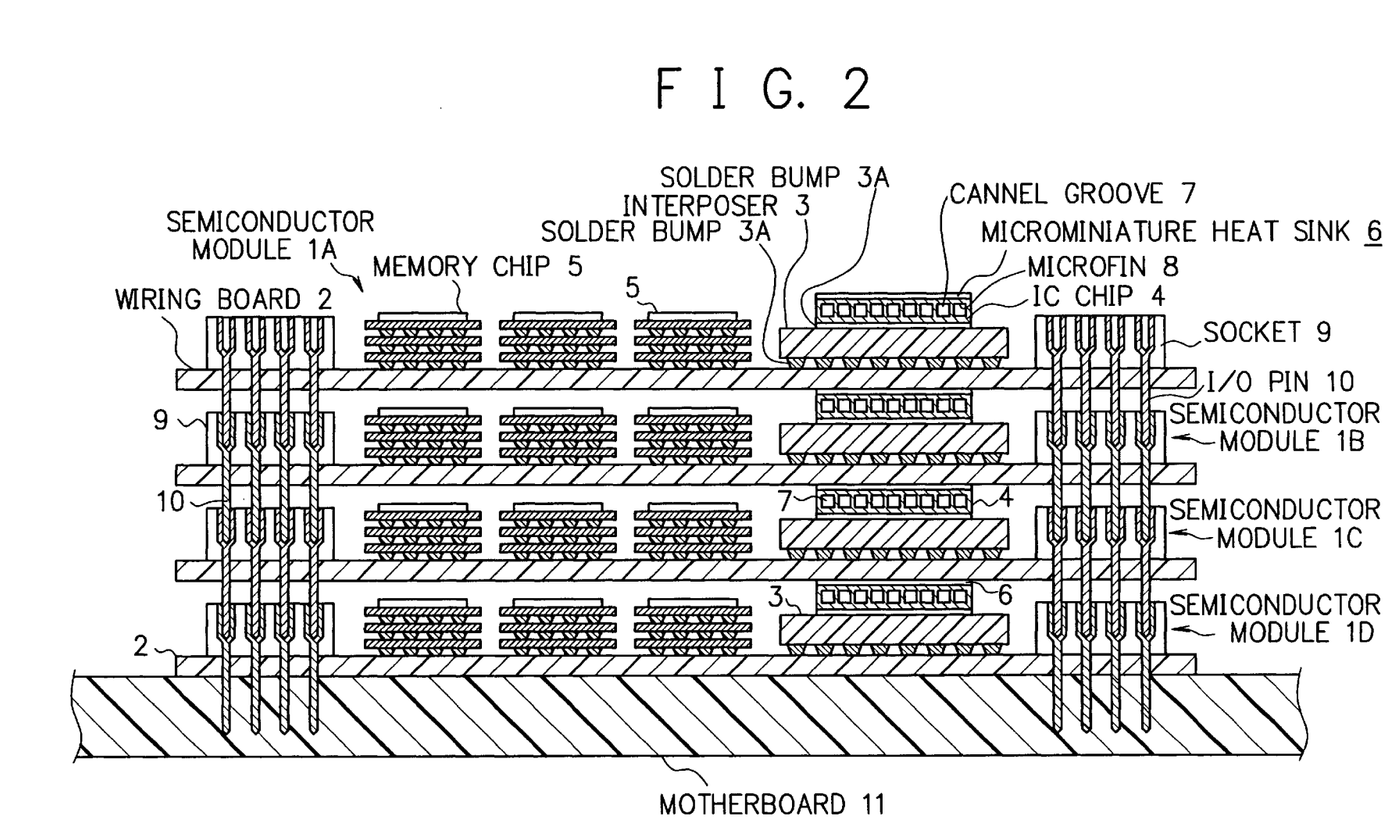
FIG. 2 is a cross sectional view showing a semiconductor device in accordance with a first embodiment of the present invention.
Figure 3A:
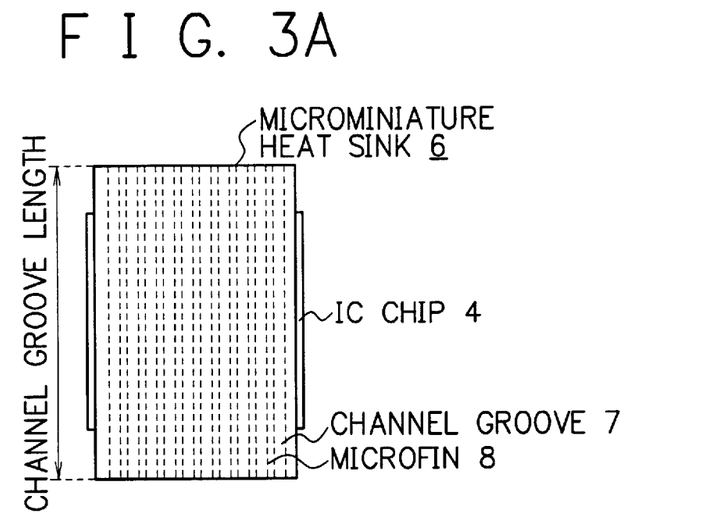
FIGS. 3A and 3B are an enlarged plan view and an enlarged cross sectional view showing an IC chip and a microminiature heat sink which are mounted on a wiring board of the semiconductor device of FIG. 2.
Figure 3B:
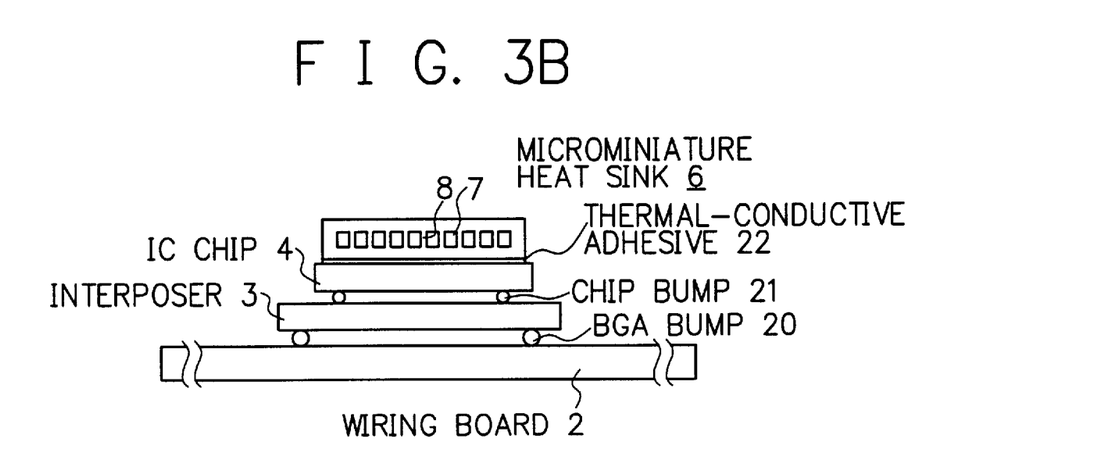

FIG. 2 is a cross sectional view showing a semiconductor device in accordance with a first embodiment of the present invention. FIGS. 3A and 3B are an enlarged plan view and an enlarged cross sectional view showing an IC chip 4 and a microminiature heat sink 6 which are mounted on a wiring board 2 of the semiconductor device of FIG. 2. As shown in FIG. 2, the semiconductor device of the first embodiment is implemented as a three-dimensional semiconductor module which is composed of a plurality of (four in the example of FIG. 2) semiconductor modules 1A~1D. In the example of FIG. 2, the semiconductor modules 1A~1D have the same composition, and thus an explanation will hereafter be given on the semiconductor module 1A only.

The semiconductor module 1A includes a wiring board 2, an interposer 3 which is mounted on the wiring board 2, an IC chip 4 which is connected to the interposer 3 via solder bumps 3A in the flip-chip connection, and a plurality of memory chips 5 which are also mounted on the wiring board 2.

Each IC chip 4 is provided with a microminiature heat sink 6. The microminiature heat sink 6 is attached to the IC chip 4 by use of a thermal-conductive adhesive 22. The thickness of the microminiature heat sink 6 is set to 1 mm or less, for example.

Figure 4:
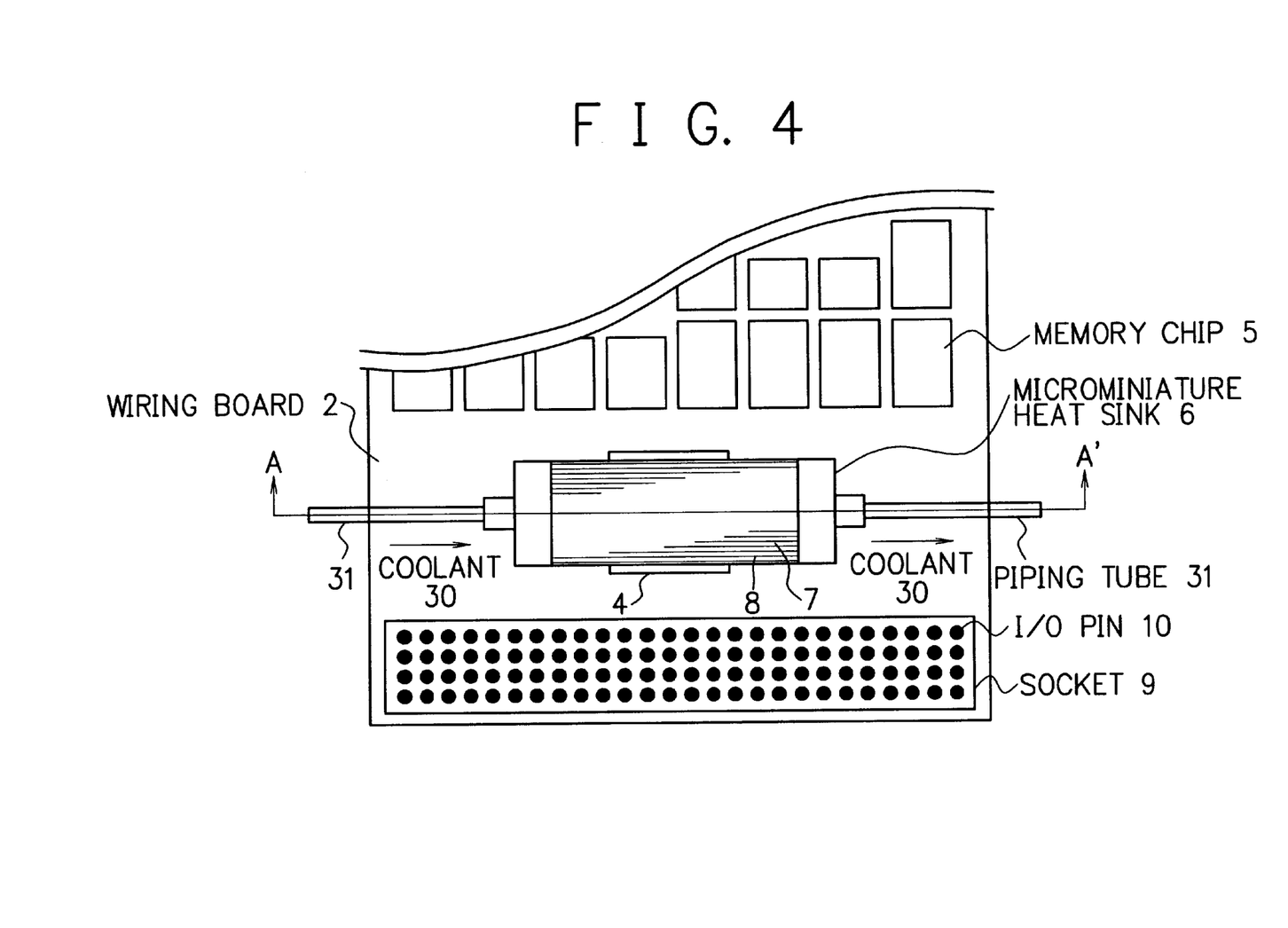
FIG. 4 is an enlarged plan view showing part of a wiring board of the semiconductor device of FIG. 2 including an IC chip and a microminiature heat sink.

The connection between the interposer 3 and the IC chip 4 is provided by chip bumps 21. The connection between the interposer 3 and the wiring board 2 is provided by BGA bumps 20. A plurality of channel grooves 7 are formed inside the microminiature heat sink 6. Walls between the channel grooves 7 function as microfins 8. To each channel groove 7 of the microminiature heat sink 6, coolant 30 which will be explained referring to FIG. 4 is supplied by an unshown cooling pump.

In order to realize three-dimensional connection of the semiconductor modules 1A~1D, low-profile sockets 9 having I/O pins 10 are attached to a wiring pattern on the surface of the wiring board 2 of each semiconductor module (1A~1D) as shown in FIG. 2. The socket 9 is provided with concavities so that I/O pins 10 of another semiconductor module 1 can be inserted thereto. Each wiring board 2 is connected to another wiring board 2 below itself by use of the I/O pins 10. The I/O pins 10 of the lowermost wiring board 2 are electrically connected to an unshown wiring pattern of a motherboard 11.

Referring to FIG. 3B, the IC chip 4 consuming high power emits large amounts of heat, and the heat emitted by the IC chip 4 is conducted through a path: IC chip 4→thermal-conductive adhesive 22→microminiature heat sink 6. The heat conducted to the microminiature heat sink 6 is transferred to the coolant 30 inside the channel grooves 7 of the microminiature heat sink 6, thereby heat conduction and cooling are carried out efficiently. By setting the length of the channel groove 7 longer than that of the IC chip 4 as shown in FIG. 3A, effective contact area between the coolant 30 of the microminiature heat sink 6 and the IC chip 4 can be made large and thereby efficient heat conduction and cooling can be attained. The cooling capacity of the microminiature heat sink 6 can be set and controlled arbitrarily by appropriately setting the number of the channel grooves 7. Therefore, almost all the heat emitted by the IC chip 4 is absorbed into the microminiature heat sink 6, thereby thermal interference between adjacent semiconductor modules 1A~1D is avoided.

An explanation will be given here on the cooling capacity of the microminiature heat sink 6. The thermal resistivity of the microminiature heat sink 6 can be reduced by increasing the number of the channel grooves 7 since contact area between the coolant 30 and the microfins 8 increases. However, pressure loss in the channel increases as the number of the channel grooves 7 is increased. Therefore, the number of the channel grooves 7 should be determined properly depending on the performance of the cooling pump. Therefore, the present inventors studied the relationship between the thermal resistivity of the IC chip 4 and the pressure loss in the channel grooves 7 by use of the following theoretical equations, taking the performance (power) of the cooling pump into consideration.

The thermal resistivity (Rtot) of the IC chip 4 can be expressed as the sum of thermal resistivity (Rfin) of the microminiature heat sink 6 and thermal resistivity (Rgrease) of the thermal-conductive adhesive 22 connecting the IC chip 4 and the microminiature heat sink 6.

$$Rtot=Rfin+Rgrease$$

The thermal resistivity (Rfin) of the microminiature heat sink 6 can be expressed by the following equation (1):

$$Rfin=(2/\lambda NuLW) \times (Wc/\alpha\eta)+(1/\rho Cpf) \qquad (1)$$

where the first term and the second term on the right side denote thermal resistivity of the microminiature heat sink 6 itself and thermal resistivity due to a temperature rise of the coolant 30, respectively. On the right side of the equation (1), "$\lambda$" denotes thermal conductivity of coolant, "Nu" denotes the Nusselt number, "L" denotes heat sink length, "W" denotes heat sink width, "Wc" denotes channel groove width, "$\alpha$" denotes an area ratio: (effective coolant contact area)/(heat emission area), "$\eta$" denotes microfin efficiency, "$\rho$" denotes coolant density, "Cp" denotes coolant specific heat, and "f" denotes coolant flow.

The thermal resistivity (Rgrease) of the thermal-conductive adhesive 22 connecting the IC chip 4 and the microminiature heat sink 6 can be expressed by the following equation (2):

$$Rgrease=t/\chi A \qquad (2)$$

where "t" denotes the thickness of the thermal-conductive adhesive 22, "$\chi$" denotes thermal conductivity of the thermal-conductive adhesive 22, and "A" denotes the area of heat source.

Figure 5:
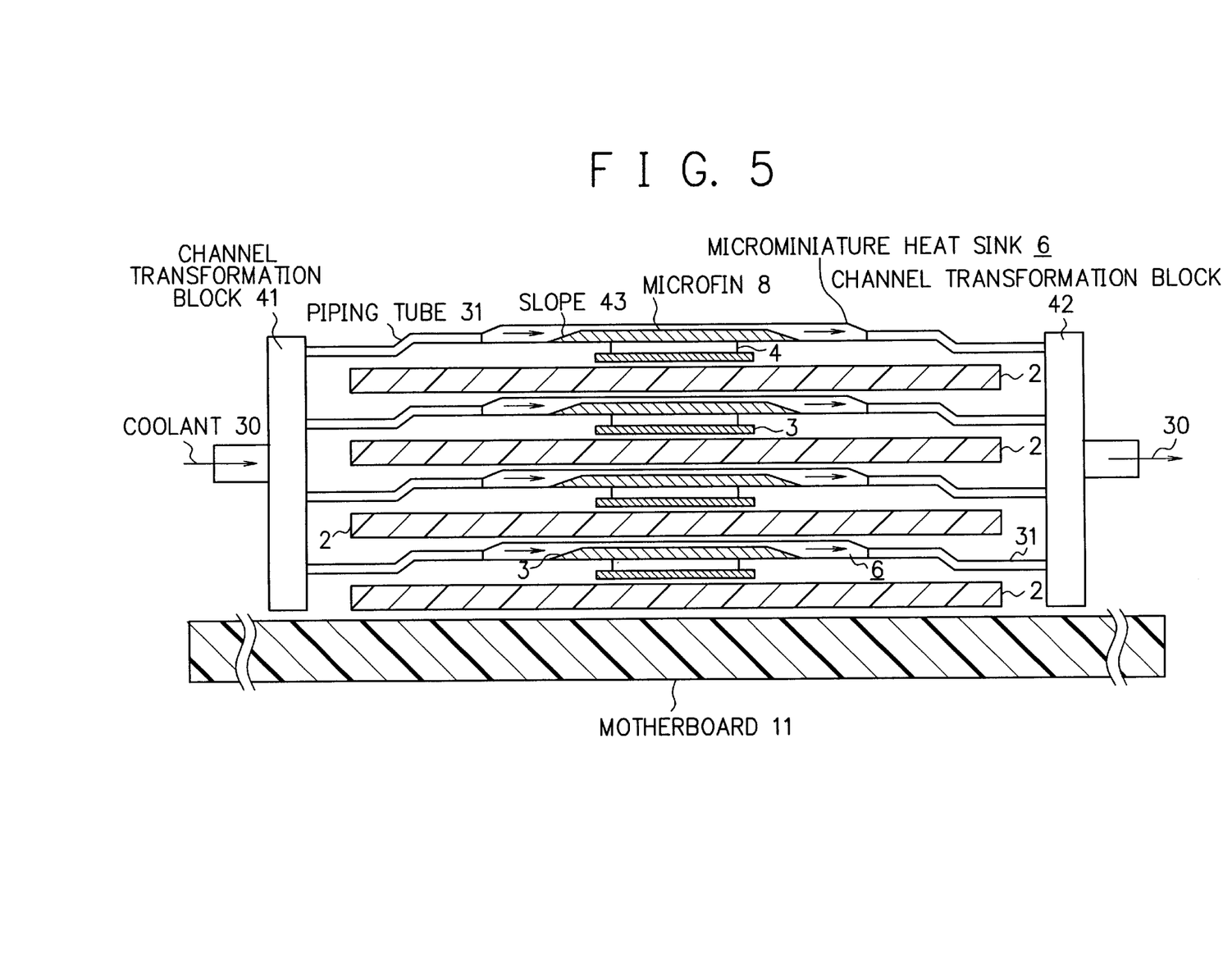
FIG. 5 is a cross sectional view of the part of FIG. 4 taken along the line A–A' shown in FIG. 4.

FIG. 4 is an enlarged plan view showing part of a wiring board 2 of the semiconductor device of FIG. 2 including an IC chip 4 and a microminiature heat sink 6. FIG. 5 is a cross sectional view of the part of FIG. 4 taken along the line A–A' shown in FIG. 4. When the coolant 30 flows through the channel grooves 7, nonnegligible pressure loss occurs. In the case of FIG. 5 where the coolant 30 flows through a channel transformation block 41, piping tubes 31 (corresponding to the semiconductor modules 1A~1D of the three-dimensional semiconductor module), channel grooves 7 of the microminiature heat sinks 6 of the semiconductor modules 1A~1D, piping tubes 31, and another channel transformation block 42, the pressure loss can be divided into two parts: a "friction pressure loss PL1" which is caused by friction between the coolant 30 and walls of the channel grooves 7 and a "local pressure loss PL2" which is caused by changes of cross sections of channels. The total pressure loss can be obtained by adding the pressure losses PL1 and PL2 together.

The friction pressure loss PL1 (caused by friction between the coolant 30 and walls of the microfins 8) can be expressed as follows:

$$PL1=F(L/de) \times (\gamma/2g)v2 \qquad (3)$$

where "F" denotes a friction coefficient, "de" denotes an equivalent waterpower diameter, "$\gamma$" denotes specific weight of air, "g" denotes gravitational acceleration, and "v" denotes flow velocity of coolant.

The local pressure loss PL2 can be expressed as follows:

$$PL2=\zeta(\gamma/2g)v2 \qquad (4)$$

where "$\zeta$" denotes a local loss coefficient due to the changes of cross sections of channels.

For example, in order to realize the cooling of the IC chip 4 of 100W class power consumption, if we limit temperature rise ΔT (ΔT=maximum CPU chip temperature T1–coolant temperature T2) to 60° C., the thermal resistivity has to be set 0.55° C./W or less. In this embodiment, an optimum value for the channel groove width Wc was calculated taking the performance of the cooling pump (pressure: $10^5$ Pa, flow: 1 liter/min) in consideration.

The calculation of the channel groove width Wc was conducted by use of the above equations assuming that the flow of the coolant 30 in the channel grooves 7 is 200 cc/min, the temperature of the coolant 30 is 30° C., and the height of the channel groove 7 is 0.3 mm. According to the calculation, the thermal resistivity gets lower as the channel groove width Wc is made narrower. However, if the channel groove width Wc is decreased below 0.2 mm, the pressure loss increases rapidly, and taking other pressure loss into account, shortage of the cooling pump power ($10^5$ Pa) is expected. Therefore, in the case where a cooling pump of such limited power is used, the width Wc of the channel groove 7 should be set to 0.2 mm or more.

As explained above, according to the calculation result of the thermal resistivity (Rtot) of the IC chip 4 obtained by use of the theoretical equations concerning thermal resistivity and pressure loss, the cooling of the IC chips 4 of the 100W class power consumption can be attained in the semiconductor module of this embodiment by setting the channel groove width Wc at 0.2 mm~0.25 mm.

Incidentally, it is of course possible to set the channel groove width Wc lower than 0.2 mm if a cooling pump of higher power can be used. However, considering processing accuracy of the channel grooves 7 of the microminiature heat sink 6, the minimum width of the channel groove should be set to 0.05 mm or more. On the other hand, the maximum width of the channel groove should be set to 0.4 mm or less taking cooling capacity into consideration.

In the following, an explanation will be given on an experiment concerning cooling capacity of the semiconductor device which has been conducted by the present inventors by stacking up IC chips 4 and constructing a three-dimensional semiconductor module.

First, a heat radiation experiment with regard to a single IC chip 4 was conducted by setting the width Wc of the channel groove 7 of the microminiature heat sink 6 at 0.2 mm and 0.24 mm. Heat radiation property was compared between the two cases (Wc: 0.2 mm, 0.24 mm). Thereafter, another heat radiation experiment with regard to a double-stack semiconductor module (in which two IC chips 4 are stacked up) was conducted in order to evaluate thermal interference.

In the first experiment concerning a single IC chip 4, in the case where the channel groove width Wc was 0.24 mm, the flow of the coolant 30 in the channel grooves 7 was 190 cc/min and the thermal resistivity was 0.42° C./W. In the case where the channel groove width Wc was 0.2 mm, the maximum flow of the coolant 30 decreased to 160 cc/min, however the thermal resistivity did not deteriorate much (0.43° C./W) in comparison with the above case where the channel groove width Wc was 0.24 mm. The result means that contact area between the coolant 30 and the channel grooves 7 (microfins 8) increased and effective thermal resistivity (when the flow of the coolant 30 is fixed between the two cases) decreased due to the decrease of the channel groove width Wc from 0.24 mm to 0.2 mm.

In the second experiment concerning a double-stack semiconductor module, microminiature heat sinks 6 having channel groove widths Wc of 0.2 mm were used for the two IC chips 4. The total flow of the coolant 30 in the two microminiature heat sinks 6 was 120 cc/min, and the thermal resistivity of each IC chip 4 (upper, lower) was within 0.48~0.52° C./W. The variation of thermal resistivity is caused by nonuniform inflow of the coolant 30. In other words, the thermal resistivity is determined by the flow of the coolant 30 in the channel grooves 7.

As is clear from the above cases, the thermal resistivity does not differ between the single IC chip 4 and the double-stack semiconductor module when the same cooling pump is used. The result means that thermal interference between IC chips 4 could be eliminated in the three-dimensional (double-stack) semiconductor module of this embodiment.

Figure 6:
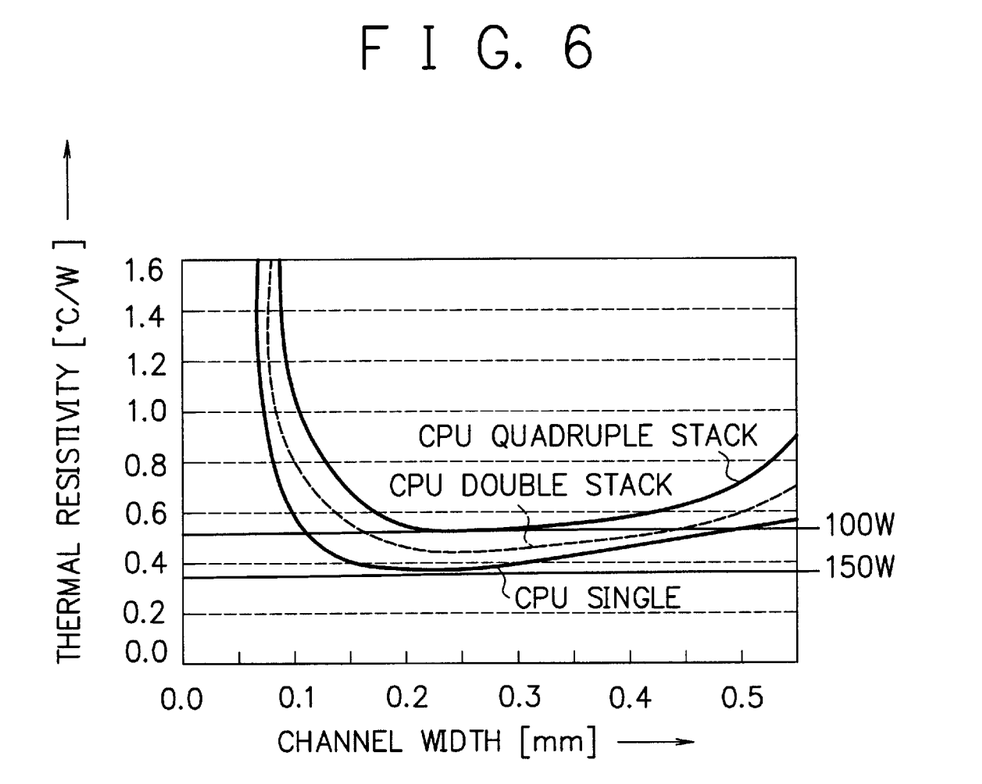
FIG. 6 is a graph showing cooling capacities of semiconductor devices in accordance with the present invention which are obtained based on theoretical calculations and experimental results.

FIG. 6 is a graph showing cooling capacities of semiconductor devices in accordance with the present invention which are obtained based on the theoretical calculations and the experimental results. In FIG. 6, cooling capacities are shown with regard to a single IC (CPU) chip 4 (CPU SINGLE), a double-stack semiconductor module using two IC chips 4 (CPU DOUBLE STACK), and a quadruple-stack semiconductor module using four IC chips 4 (CPU QUADRUPLE STACK). In the cases of three-dimensional (double-stack, quadruple-stack) semiconductor modules, cooling of the IC chips 4 (CPU chips) were carried out by use of parallel channels which are realized by channel transformation blocks 41 and 42, as shown in FIG. 5. Each curve of FIG. 6 shows the relationship between the channel groove width Wc and the thermal resistivity on the assumption that the same cooling pump is used for the three cases.

Internal pressure inside the channel groove 7 changes depending on the channel groove width Wc, therefore, there exists an optimum channel groove width Wc for each semiconductor module (single, double-stack, quadruple-stack). As the number of the stacked IC chips 4 increases, the thermal resistivity increases since the flow of the coolant 30 in each microminiature heat sink 6 decreases. Therefore, in the case of the single IC chip 4, power consumption of 150W per CPU is allowable as shown in FIG. 6. In the case of the quadruple-stack semiconductor module, power consumption of 100W per CPU is allowable.

[Embodiment 2]

In the following, a semiconductor device in accordance with a second embodiment of the present invention will be explained referring to FIGS. 4 and 5. In the second embodiment, each microfin 8 in the microminiature heat sink 6 is provided with slopes 43 at its both ends (inflow section and outflow section) as shown in FIG. 5, thereby a remarkable effect is obtained. By the slopes 43 at the inflow section and the outflow section of the microfin 8, pressure loss occurring at the microminiature heat sink 6 is reduced much, the flow of the coolant 30 supplied to the channel grooves 7 is increased much, and thereby cooling efficiency is improved much.

According to an experiment conducted by the present inventors, the pressure loss of the coolant 30 flowing along the channel groove 7 (microfins 8) was comparatively small (10~20% of the total pressure loss of the cooling system). Pressure loss in between the cooling pump and the microminiature heat sink 6 through the channel transformation block 41 was approximately 30%. Remaining 50% (assuming that the pressure loss along the channel grooves 7 is 20%) of the total loss occurs at the inflow sections and outflow sections (mainly at the inflow sections) of the channel grooves 7 (microfins 8). Therefore, the effect of the decrease/increase of the channel cross section at the inflow sections and outflow sections on the pressure loss is large.

Therefore, by the provision of the slopes 43 at the inflow sections (where channel cross section rapidly decreases) and outflow sections (where channel cross section rapidly increases) of the microfins 8, pressure loss caused by colliding currents etc. (which occur when the edges of the microfin 8 are right-angled) can be reduced and thereby the total pressure loss can be reduced much. By the reduction of the pressure loss, coolant flow through the channel grooves 7 of the microminiature heat sink 6 is increased much and thereby cooling efficiency of the microminiature heat sink 6 is improved remarkably. The slopes 43 also contribute to the prevention of fluid leaks etc., thereby reliability of the cooling system and the semiconductor device is improved.

Figure 7A:
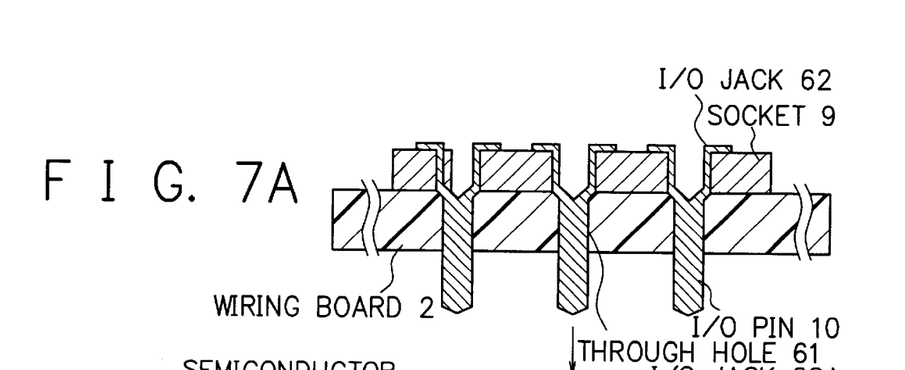
FIG. 7A and FIG. 7B are enlarged cross sectional views showing an example of the composition of a socket and I/O pins of the semiconductor device in accordance with the present invention.
Figure 7B:
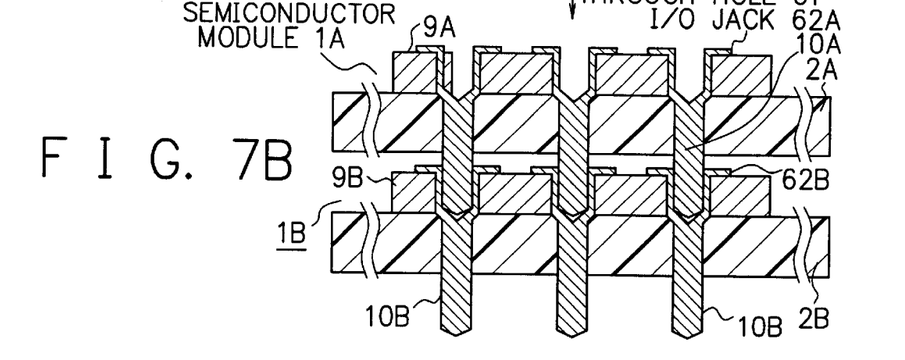

FIG. 7A and FIG. 7B are enlarged cross sectional views showing an example of the composition of the socket 9 and the I/O pins 10.

As shown in FIG. 7A, the low-profile socket 9 (thickness: 1 mm or less) which is attached to the wiring board 2 is provided with through holes at predetermined intervals. I/O pins 10 are formed at the through holes of the socket 9 so as to protrude from the socket 9. An I/O jack 62 (concavity) is formed at the top of each I/O pin 10. The I/O pins protruding from the socket 9 are inserted into through holes 61 of the wiring board 2 so as to penetrate and protrude from the wiring board 2 as shown in FIG. 7A, thereby the attachment of the socket 9 to the wiring board 2 is completed.

When two wiring boards 2 (2A, 2B) of two semiconductor modules (1A, 1B) are connected together, the I/O pins 10 protruding from a wiring board 2 (2A) are inserted into I/O jacks of another wiring board 2 (2B) as shown in FIG. 7B, thereby electrical connection between the two semiconductor modules is established. Means to be used for adhesion or connection between the I/O pins 10 and the into I/O jacks are not particularly limited. For example, either fixation by means of contact friction or adhesion by means of solder can be employed. It is also possible to employ I/O pins 10 or I/O jacks 62 that become deformed due to the insertion of the I/O pins 10 into the I/O jacks 62 so as to ensure the fixation and connection between the wiring boards 2. While stacking and connection of two semiconductor modules (two wiring boards 2) are shown in FIG. 7B, stacking and connection of three or more wiring boards 2 can be carried out in the same way.

On each wiring board 2, an IC chip 4 and a plurality of memory chips are mounted so as to form a multi-chip module. By such multi-chip arrangement on a wiring board 2, sharing of bus systems and power supply terminals can be attained and thereby the number of necessary I/O terminals can be reduced. The sockets 9 and the I/O pins 10 can be implemented by use of general purpose parts, therefore, the three-dimensional semiconductor module can be constructed at a low cost. Detachment/attachment between the semiconductor modules (wiring boards) can be done easily by use of solder bumps, therefore, the replacement of defective IC chips etc. can be done with ease.

Figure 8:
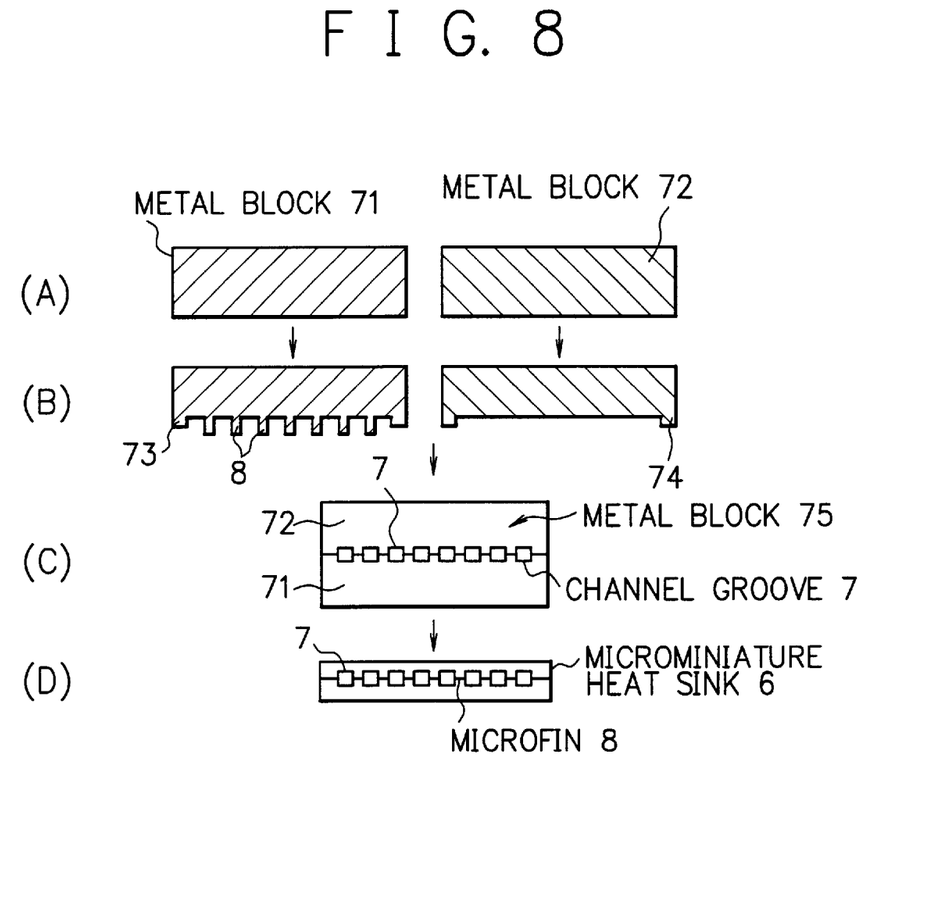
FIG. 8 is a schematic diagram showing an example of a process for manufacturing the microminiature heat sink.

FIG. 8 is a schematic diagram showing an example of a process for manufacturing the microminiature heat sink 6. As shown in (A) of FIG. 8, the microminiature heat sink 6 is manufactured by use of two metal blocks 71 and 72. The metal blocks 71 and 72 are formed of metallic material having high thermal conductivity such as copper, aluminum, etc. On the metal block 71, the channel grooves 7, the microfins 8 (whose thickness is set to a predetermined permissible thickness (design value) or more), and the slopes 43 at both ends of the microfins 8 are formed. The metal block 72 functions as a lid for covering the microfins 8 of the metal block 71. Grooves of a width of 0.2~0.3 mm are formed on the metal block 71 by means of machining using a cutter (width~0.2 mm) or by means of electrical discharge machining using a wire (diameter~0.1 mm), thereby the channel grooves 7 and the microfins 8 are formed as shown in (A) of FIG. 8. Convex part 73 at both ends of the metal block 71 are formed (cut off) so as to be lower than the height of the microfins 8. For mass production, it is also possible to form the above structure by means of molding and thereby reduce costs. Meanwhile, the metal block 72 is machined so as to have convex parts 74 at its both ends as shown in (B) of FIG. 8. The height and shape of the convex parts 74 are set so that no gap occurs when the convex parts 74 are butt-joined to the convex parts 73 of the metal block 71.

Thereafter, the metal blocks 71 and 72 are butt-joined by means of diffusion bonding etc. as shown in (C) of FIG. 8. In the diffusion bonding, the metal block 72 is paired with the metal block 71 so that the convex parts 74 will be aligned with the convex parts 73, and pressure and heat are applied to the paired metal blocks so that the metal blocks 71 and 72 will be joined together. Thereafter, machining is conducted to the joined metal block so that the metal block will have a predetermined thickness (1 mm or less, for example) and shape (suitable for being attached to the IC chip 4 and for the inflow of the coolant 30), thereby the microminiature heat sink 6 is completed as shown in (D) of FIG. 8.

By the employment of the wire electrical discharge machining and the diffusion bonding by means of surface activation, the metal blocks 71 and 72 are joined together firmly, thereby fluid leaks due to the inflow of the coolant 30 is prevented and high reliability is attained.

While the three-dimensional semiconductor modules of the above embodiments have been constructed by stacking up wiring boards 2 having the same composition (including an IC chip 4 and a plurality of memory chips 5) as shown in FIG. 2, the semiconductor device in accordance with the present invention is not limited to such three-dimensional semiconductor modules. For example, it is also possible to stack up semiconductor modules 1 (wiring boards 2) having different components and circuit composition. It is also possible to stack up IC chips 4 (or chips exhibiting high local heat emission) only, so as to have local three-dimensional packing structure. Therefore, the sizes or areas of the semiconductor modules 1 (wiring boards 2) to be stacked up can be varied (chip size~board size) depending on design requirements. The sectional form of the channel groove 7 is not necessarily required to be rectangular, but can also be triangular, circular, polygonal, etc. The coolant 30 is not limited to cooling water, but other heat-absorbing liquids (such as alcohol) can also be used. Materials (metal, plastic, vinyl, etc.) to be used for the channel transformation blocks 41 and 42 and the piping tubes 31 are not particularly limited. The shapes, numbers, arrangements, etc. of the channel transformation blocks 41 and 42 and the piping tubes 31 for supplying the coolant 30 to the microminiature heat sinks 6 of the IC chips 4 of the semiconductor modules 1 is not limited to the example of FIG. 5 but can be varied in various ways. Although not shown in the figures, a forcedly air-cooled radiator is preferably provided to the path of the coolant 30 between the cooling pump and the channel transformation block 41/42. While all the IC chips 4 were provided with the heat sinks 6 in the above embodiments, it is also possible to omit some of the heat sinks 6.

As set forth hereinabove, in the semiconductor devices in accordance with the present invention, a semiconductor module is constructed by use of a wiring board, one or more IC chips which are mounted on the wiring board and which emit heat during their operation, and one or more heat sinks which are attached to the IC chips via a thermal-conductive adhesive and are forcedly cooled by a coolant flowing through channels which are formed therein, and two or more of such semiconductor modules are stacked up into three-dimensional structure. In other expression (or in a little wider meaning), the semiconductor device of the present invention comprises two or more semiconductor modules which are stacked up into three-dimensional structure, in which the semiconductor module includes a wiring board, one or more IC chips which are mounted on the wiring board and which emit heat during their operation, and one or more heat sinks which are attached to some of the IC chips via a thermal-conductive adhesive and are forcedly cooled by a coolant flowing through channels which are formed therein.

By the semiconductor devices in accordance with the present invention, signal lines between the IC chips stacked into three-dimensional structure can be shortened in comparison with the conventional semiconductor device of FIG. 1 and the conventional water cooling system of NEC technical report Vol. 39 thanks to the low-profile microminiature heat sinks (thickness: 1 mm or less, for example), thereby attenuation and delay of signals can be reduced and thereby speeding up of electronic equipment can be attained.

The coolant is supplied to the channel grooves of the heat sinks from outside and the IC chips are forcedly cooled by the coolant, therefore, heat emitted by IC chips can be transferred and released to the coolant in the heat sink almost perfectly. Therefore, cooling capacity can be improved and thermal interference can be avoided more efficiently in comparison with the conventional air cooling systems and the heat pipe cooling system of Japanese Patent Application Laid-Open No. HEI5-275584, even if low-profile heat sinks are employed. Concretely, cooling capacity of 100 W per chip or more (thermal resistivity: 0.55° C./W) could be attained by the semiconductor device of the present invention, and thermal resistivity per unit volume can be reduced in comparison with conventional air cooling systems.

Therefore, both high processing speed (due to high packing density and short signal lines between IC chips) and sufficient cooling capacity can be attained by the semiconductor devices in accordance with the present invention. The semiconductor devices of the present invention are suitable and advantageous to application to computers having a plurality of high-power IC chips for distributed/parallel processing.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A semiconductor device wherein:
   a semiconductor module is constructed by use of a wiring board, one or more IC chips which are mounted on the wiring board and which emit heat during their operation, and one or more heat sinks which are attached to the IC chips via a thermal-conductive adhesive and are forcedly cooled by a coolant flowing in parallel through parallel channels which are formed therein wherein the heat sink extends across only one surface of the IC chip, and two or more of such semiconductor modules are stacked up into a three-dimensional structure.

2. A semiconductor device as claimed in claim 1, wherein:
   the wiring board of each semiconductor module is provided with sockets having I/O pins and concavities, and
   electrical connection between adjacent semiconductor modules of the semiconductor device is established by inserting the I/O pins of the sockets of one semiconductor module into the concavities of the sockets of the other semiconductor module.

3. A semiconductor device as claimed in claim 1, wherein the channels in the heat sink are implemented by a plurality of channel grooves which are generated between a plurality of fins which are formed in a cavity inside the heat sink at predetermined intervals.

4. A semiconductor device as claimed in claim 3, wherein the heat sink includes:
   a first metal block having the channel grooves and the fins; and
   a second metal block which is joined to the first metal block so as to cover the fins of the first metal block.

5. A semiconductor device as claimed in claim 1, wherein each of the fins of the heat sink is provided with slopes at both ends.

6. A semiconductor device as claimed in claim 3, wherein the width of the channel groove in the heat sink is set to 0.05 mm~0.4 mm.

7. A semiconductor device as claimed in claim 6, wherein the width of the channel groove in the heat sink is set to 0.2 mm~0.25 mm.

8. A semiconductor device as claimed in claim 3, wherein the length of the channel groove in the heat sink is set to the length of the IC chip or more.

9. A semiconductor device as claimed in claim 1, wherein the thickness of the heat sink is set to 1 mm or less.

10. A semiconductor device as claimed in claim 1, further comprising a forcedly air-cooled radiator for cooling the coolant.

11. A semiconductor device comprising two or more semiconductor modules which are stacked up into three-dimensional structure, wherein the semiconductor module includes:
    a wiring board;
    one or more IC chips which are mounted on the wiring board and which emit heat during their operation; and
    one or more heat sinks which are attached to some of the IC chips via a thermal-conductive adhesive and are forcedly cooled by a coolant flowing in parallel through parallel channels which are formed therein wherein the heat sink extends across only one surface of the IC chip.

12. A semiconductor device as claimed in claim 11, wherein:
    the wiring board of each semiconductor module is provided with sockets having I/O pins and concavities, and
    electrical connection between adjacent semiconductor modules of the semiconductor device is established by inserting the I/O pins of the sockets of one semiconductor module into the concavities of the sockets of the other semiconductor module.

13. A semiconductor device as claimed in claim 11, wherein the channels in the heat sink are implemented by a plurality of channel grooves which are generated between a plurality of fins which are formed in a cavity inside the heat sink at predetermined intervals.

14. A semiconductor device as claimed in claim 13, wherein the heat sink includes:
   a first metal block having the channel grooves and the fins; and
   a second metal block which is joined to the first metal block so as to cover the fins of the first metal block.

15. A semiconductor device as claimed in claim 13, wherein each of the fins of the heat sink is provided with slopes at both ends.

16. A semiconductor device as claimed in claim 13, wherein the width of the channel groove in the heat sink is set to 0.05 mm~0.4 mm.

17. A semiconductor device as claimed in claim 16, wherein the width of the channel groove in the heat sink is set to 0.2 mm~0.25 mm.

18. A semiconductor device as claimed in claim 13, wherein the length of the channel groove in the heat sink is set to the length of the IC chip or more.

19. A semiconductor device as claimed in claim 11, wherein the thickness of the heat sink is set to 1 mm or less.

20. A semiconductor device as claimed in claim 11, further comprising a forcedly air-cooled radiator for cooling the coolant.

21. A semiconductor device as recited in claim 1, wherein each said channel has a channel width in a range such that thermal resistivity of said heat sinks changes little with change of channel width for a given coolant pumping power.

22. A semiconductor device as recited in claim 11, wherein each said channel has a channel width in a range such that thermal resistivity of said heat sinks changes little with change of channel width for a given coolant pumping power.

* * * * *